(12) United States Patent
Kato et al.

(10) Patent No.: US 8,378,464 B2
(45) Date of Patent: Feb. 19, 2013

(54) METHOD FOR MANUFACTURING SEMICONDUCTOR DEVICE, SEMICONDUCTOR DEVICE, SEMICONDUCTOR MANUFACTURING APPARATUS AND STORAGE MEDIUM

(75) Inventors: Yoshihiro Kato, Nirasaki (JP); Yusaku Kashiwagi, Nirasaki (JP); Takashi Matsumoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 503 days.

(21) Appl. No.: 12/683,073

(22) Filed: Jan. 6, 2010

(65) Prior Publication Data

US 2010/0171198 A1 Jul. 8, 2010

Related U.S. Application Data

(63) Continuation of application No. PCT/JP2008/062203, filed on Jul. 4, 2008.

(30) Foreign Application Priority Data

Jul. 6, 2007 (JP) ................................. 2007-178755

(51) Int. Cl.
*H01L 21/312* (2006.01)
*H01L 29/06* (2006.01)
(52) U.S. Cl. ................. 257/632; 438/780; 257/E21.259
(58) Field of Classification Search .................. 257/632, 257/E21.259, E29.006, E21.256; 118/667; 438/780
See application file for complete search history.

(56) References Cited

U.S. PATENT DOCUMENTS

| 6,015,596 | A  * | 1/2000 | Miwa et al. ................... 427/489 |
| 7,011,889 | B2 * | 3/2006 | Bedwell et al. ............... 428/447 |
| 7,019,386 | B2 * | 3/2006 | Ghoshal et al. ............... 257/642 |
| 7,115,531 | B2 * | 10/2006 | Shaffer et al. ................. 438/780 |
| 7,807,267 | B2 * | 10/2010 | Kohmura et al. ............. 428/447 |
| 2001/0021590 | A1 | 9/2001 | Matsuki |
| 2003/0224622 | A1 | 12/2003 | Matsuki et al. |
| 2004/0067308 | A1 | 4/2004 | Zheng et al. |
| 2007/0062453 | A1 | 3/2007 | Ishikawa |

FOREIGN PATENT DOCUMENTS

| JP | 2000-269208 | 9/2000 |
| JP | 2004-228581 | 8/2004 |
| JP | 2006-502586 | 1/2006 |
| JP | 2006-351806 | 12/2006 |

\* cited by examiner

*Primary Examiner* — Roy Potter
(74) *Attorney, Agent, or Firm* — Oblon, Spivak, McClelland, Maier & Neustadt, L.L.P.

(57) ABSTRACT

A method for manufacturing a semiconductor device includes steps of: (a) forming a thin film containing a phenyl group and silicon on a substrate while obtaining a plasma by activating an organic silane gas containing a phenyl group and silicon and nitrogen as not original component but unavoidable impurity and exposing the substrate to the plasma, temperature of the substrate being set at 200° C. or lower; and (b) obtaining a low-permittivity film by supplying energy to the substrate to allow moisture to be released from the thin film. With this method for manufacturing the semiconductor device, it is possible to obtain a silicon-oxide based low-permittivity film containing an organic substance which is not significantly damaged by the release of the organic substance when subjected to a plasma treatment such as an etching treatment, an ashing treatment, and/or the like.

6 Claims, 14 Drawing Sheets

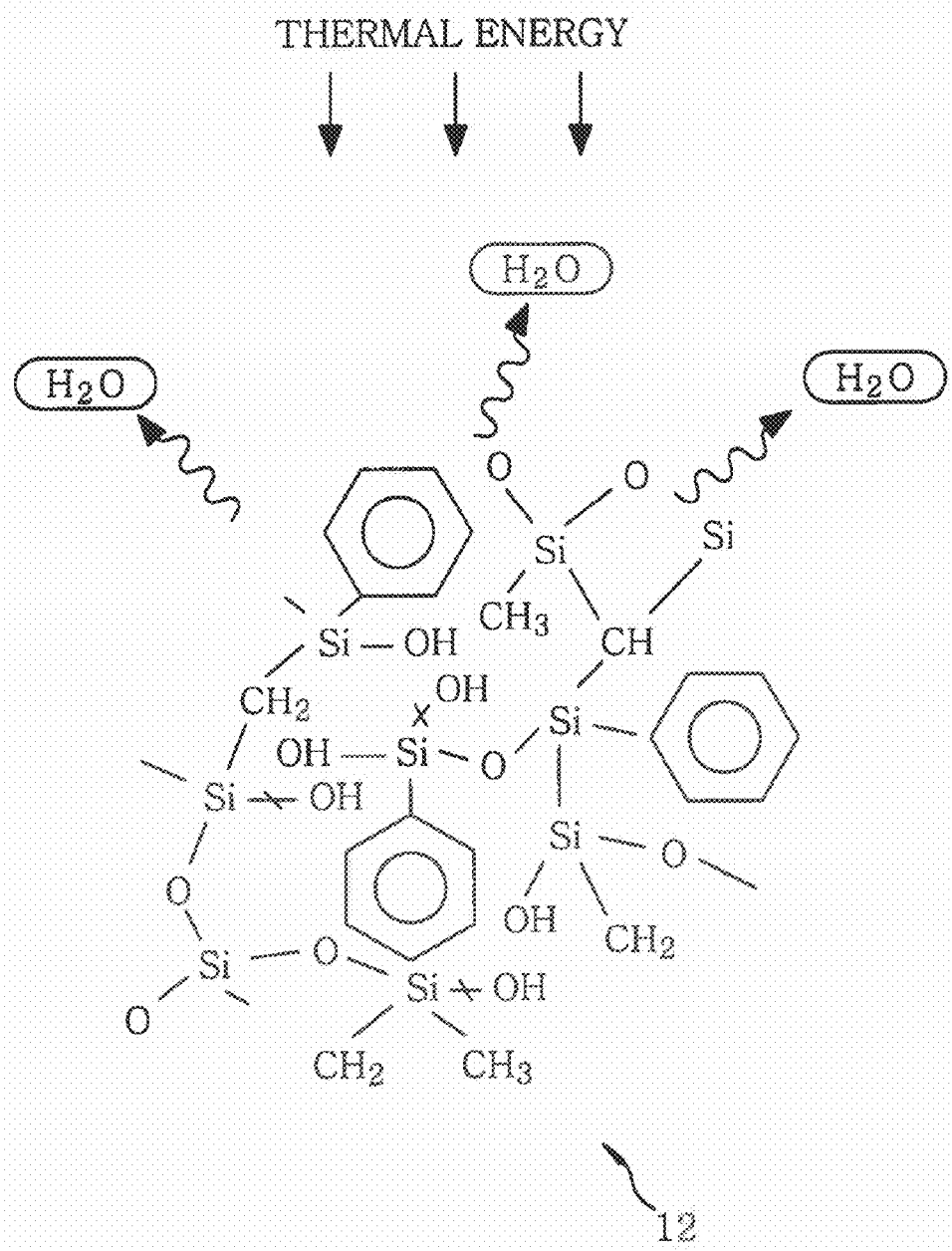

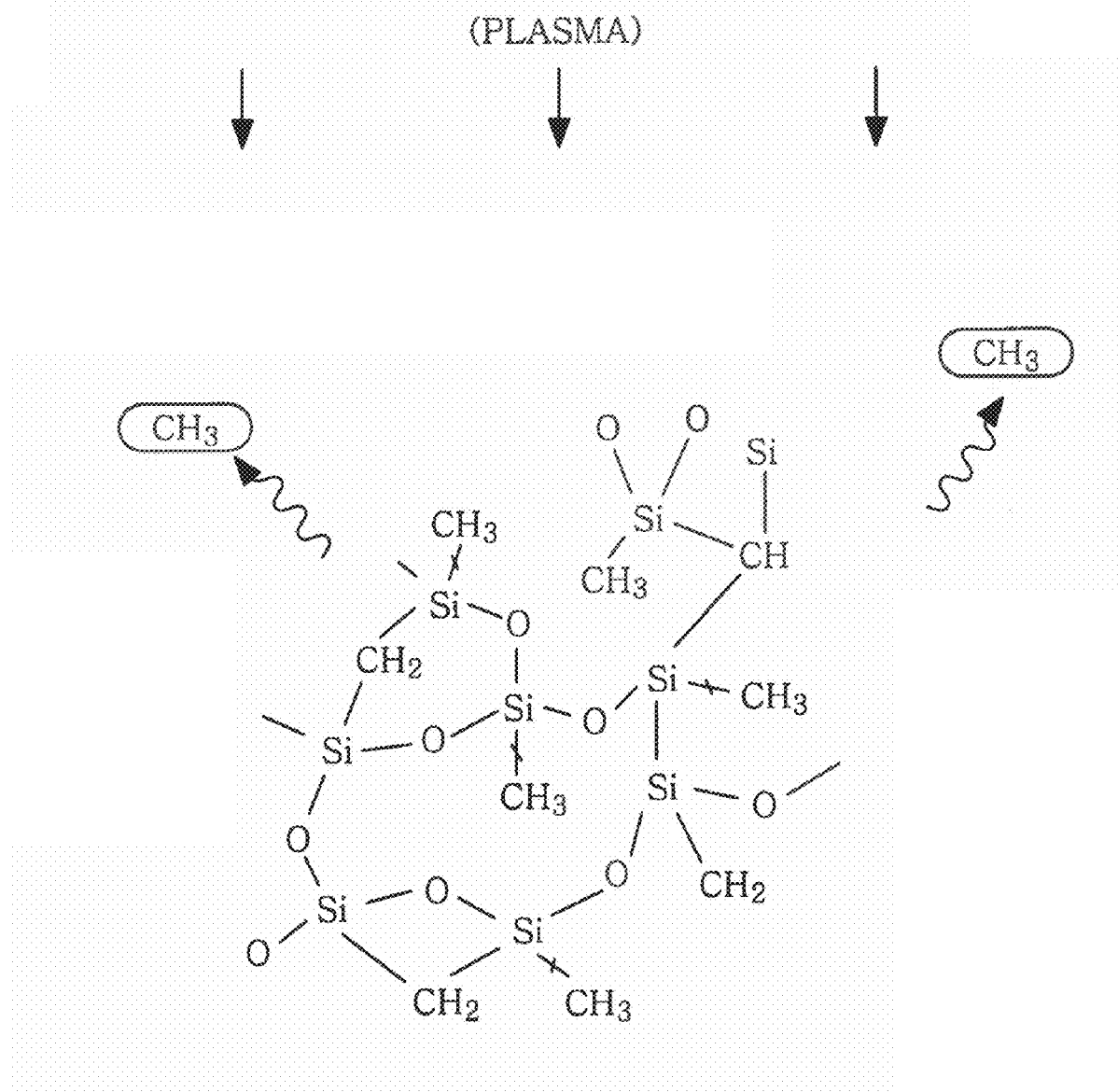

METHOD FOR MANUFACTURING SEMICONDUCTOR DEVICE, SEMICONDUCTOR DEVICE, SEMICONDUCTOR MANUFACTURING APPARATUS AND STORAGE MEDIUM

This application is a Continuation Application of PCT International Application No. PCT/JP2008/062203 filed on Jul. 4, 2008, which designated the United States.

FIELD OF THE INVENTION

The present invention relates to a technique for forming a low-permittivity film having a good plasma resistance on a substrate.

BACKGROUND OF THE INVENTION

With the high integration of semiconductor device, the scaling down of wiring has been in progress. To that end, it is needed that an interlayer dielectric film has a low permittivity to suppress wiring delay. A $SiO_2$ film, conventionally employed as an interlayer dielectric film, has a dielectric constant of about 4.0 which is not considered to be sufficiently low. Accordingly, various low-permittivity films have been tested and an SiCOH film having a dielectric constant of about 3.2 has been known as one of the candidates under consideration.

As shown in FIG. 13, the SiCOH film is formed by mainly introducing a $CH_3$ group as an organic component into the $SiO_2$ film. The SiCOH film is formed by using, e.g., a silane-based gas having a methyl group as a source material. Due to the introduction of the organic component, a film density of the SiCOH film gets lowered and, accordingly, the dielectric constant of the SiCOH film becomes lowered, too.

Further, to form a groove for burying the wiring or a connection hole in an interlayer dielectric film, a plasma etching is performed on the interlayer dielectric film and then ashing of a photoresist mask is performed. Since, however, the SiCOH film has a small film density, the SiCOH film is easily damaged by the plasma. Further, if the SiCOH film is exposed to the plasma, an organic substance is released from the SiCOH film.

To lower the permittivity of the SiCOH film, it is needed to increase a content ratio of an organic substance in the SiCOH film, for example. However, if the content ratio of the organic substance is increased, the plasma resistance of the SiCOH film gets lowered and the SiCOH film can be more easily damaged by the plasma. Further, if the SiCOH film contains a large amount of organic component, film strength of the SiCOH film gets lowered. As such, in the SiCOH film, lowering the permittivity and the plasma resistance (or the mechanical strength) are in a trade-off relationship. Accordingly, it is needed to develop an interlayer dielectric film having a low dielectric constant as well as a high plasma resistance and mechanical strength.

Japanese Patent Application Publication No. 2000-269208 (especially, paragraph Nos. 0022 and 0023) has disclosed a technique for forming an organic silica film containing a phenyl group at a low temperature by a thermal chemical vapor deposition (CVD) with bisdimethyl-amino-diphenyl-silane as a source gas and then removing the phenyl group from the film, wherein areas containing the phenyl group become hollowed out to have high porosity. Accordingly, it is possible to obtain a porous film having a low dielectric constant. Since, however, the source gas contains nitrogen, the dielectric constant is increased if the nitrogen remains in the film. In other words, it is difficult to obtain the interlayer dielectric film having a low dielectric constant while preserving a high plasma resistance and mechanical strength by the technique of Japanese Patent Application Publication No. 2000-269208.

SUMMARY OF THE INVENTION

In view of the above, an object of the present invention is to provide a technique for forming a low-permittivity film having a high plasma resistance and a high mechanical strength and a semiconductor device including the low-permittivity film having the high plasma resistance and the high mechanical strength.

In accordance with the present invention, there is provided a method for manufacturing a semiconductor device including steps of: (a) forming a thin film containing a phenyl group and silicon on a substrate while obtaining a plasma by activating an organic silane gas containing a phenyl group and silicon and nitrogen as not original component but unavoidable impurity and exposing the substrate to the plasma, temperature of the substrate being set at 200° C. or lower; and (b) obtaining a low-permittivity film by supplying energy to the substrate to allow moisture to be released from the thin film.

In the method for manufacturing a semiconductor device in accordance with the present invention, the step (a) of forming the thin film may include a step of activating a gaseous mixture where the organic silane gas and oxygen gas are mixed.

In the method for manufacturing a semiconductor device in accordance with the present invention, the step (b) of obtaining the low-permittivity film by allowing the moisture to be released from the thin film may include at least one of stages of heating the substrate to be maintained at a temperature higher than 200° C.; irradiating an ultraviolet to a surface of the substrate; and exposing the surface of the substrate to a plasma obtained by activating hydrogen gas.

In the method for manufacturing a semiconductor device in accordance with the present invention, a dielectric constant of the low-permittivity is equal to or smaller than 3.2.

In accordance with the present invention, a semiconductor device includes a low-permittivity film obtained by the method for manufacturing a semiconductor device.

In accordance with the present invention, a semiconductor manufacturing apparatus includes a plasma CVD apparatus including: a processing chamber for accommodating a substrate; a supply unit for supplying to the processing chamber an organic silane gas containing a phenyl group and silicon and only unavoidable impurity nitrogen; an activation unit for activating a gas in the processing chamber to generate a plasma; and a control unit for controlling processing temperature of the processing apparatus, wherein temperature of the substrate is maintained to be equal to or lower than 200° C. and the substrate is exposed to the plasma to form a thin film on the substrate, and an after-treatment apparatus including an energy supply unit for supplying an energy to the substrate on which a thin film is formed by the plasma CVD apparatus, wherein moisture is released from the thin film by supplying the energy to the substrate to form a low-permittivity film.

In the semiconductor manufacturing apparatus in accordance with the present invention, the plasma CVD apparatus further includes a supply unit for supplying oxygen gas to the processing chamber, and the activation unit activates the oxygen gas and the organic silane gas together in the processing chamber.

In the semiconductor manufacturing apparatus in accordance with the present invention, the after-treatment apparatus includes at least one of devices for heating the substrate to be maintained at a temperature higher than 200° C., for irradiating an ultraviolet to a surface of the substrate, and for exposing the surface of the substrate to a plasma obtained by hydrogen gas.

The semiconductor manufacturing apparatus in accordance with the present invention may further include a vacuum transfer module arranged between the plasma CVD apparatus and the after-treatment apparatus.

In the semiconductor manufacturing apparatus in accordance with the present invention, the plasma CVD apparatus and the after-treatment apparatus are provided as a single unit.

In accordance with the present invention, there is provided a storage medium storing a program that is executable by a control device for controlling a semiconductor manufacturing apparatus. The program performs a method for manufacturing a semiconductor device in a semiconductor manufacturing apparatus by being executed by the control device. The method includes steps of (a) forming a thin film containing a phenyl group and silicon on a substrate while obtaining a plasma by activating an organic silane gas containing a phenyl group and silicon and nitrogen as not original component but unavoidable impurity and exposing the substrate to the plasma, temperature of the substrate being set at 200° C. or lower; and (b) obtaining a low-permittivity film by supplying energy to the substrate to allow moisture to be released from the thin film.

In accordance with the present invention, it is possible to obtain a low-permittivity film having a high plasma resistance and a high mechanical strength.

BRIEF DESCRIPTION OF THE DRAWINGS

FIG. 2B shows another example of the structure of the interlayer dielectric film capable of being formed by the process shown in FIGS. 1A to 1F.

FIG. 13 shows an example of a structure of a conventional interlayer dielectric film, corresponding to FIGS. 2A to 2C.

DETAILED DESCRIPTION OF THE EMBODIMENTS

[First Embodiment]

Figure 1A:
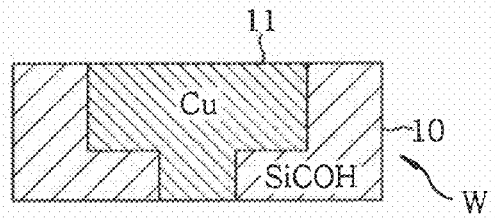
FIG. 1A is a cross sectional view showing a method for manufacturing a semiconductor device in accordance with an embodiment of the present invention.

A method for manufacturing a semiconductor device in accordance with a first embodiment of the present invention will be described with reference to FIGS. 1A to 1F. FIG. 1A shows an $n^{th}$ (lower side) circuit layer formed on a wafer W as a substrate. In the circuit layer, a wire 11 made of a metal, e.g., copper (Cu) or the like is buried in an SiCOH film 10 as an interlayer dielectric film. Moreover, a barrier film is formed between the SiCOH film 10 and the wire 11 to suppress the diffusion of metal. A barrier film is also formed at an upper layer of the $n^{th}$ circuit layer to suppress the diffusion of metal from the SiCOH film 10 to an $(n+1)^{th}$ circuit layer. The barrier films are not shown in related drawings.

Figure 1B:
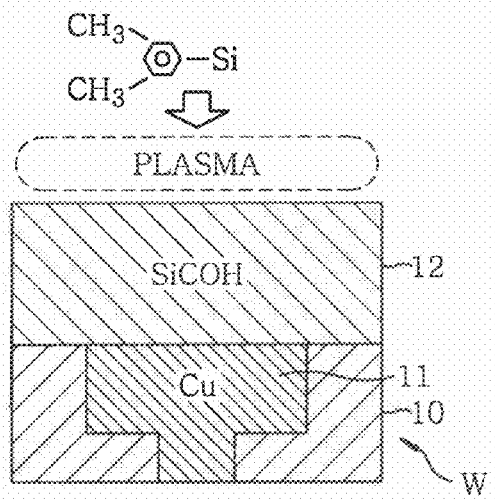
FIG. 1B is another cross sectional view showing the method for manufacturing the semiconductor device in accordance with the embodiment of the present invention.

As shown in FIG. 1B, an SiCOH film 12 is firstly formed on a surface of the $n^{th}$ circuit layer by a plasma chemical vapor deposition (CVD). As a source gas, an organic silane gas containing a phenyl group and silicon but no nitrogen is employed. For example, a processing gas including oxygen gas and dimethyl-phenyl-silane (DMPS) gas as the organic silane gas is employed. The processing gas is converted to a plasma (active species) by, e.g., a parallel plate type plasma treatment apparatus. Then, a wafer W whose temperature is set to be equal to or lower than, e.g., 200° C. is exposed to the plasma. As a result, the SiCOH film 12 is formed on the wafer W.

Figure 2A:
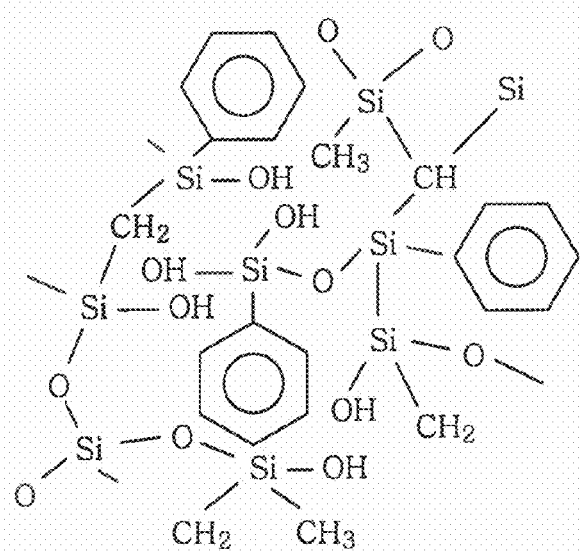
FIG. 2A shows an example of a structure of an interlayer dielectric film capable of being formed by the process shown in FIGS. 1A to 1F.

As such, by forming a film at a low temperature, many phenyl groups of the DMPS gas as a component of the source gas are received into the SiCOH film 12 in a surface reaction during the film formation. Accordingly, as shown in FIG. 2A, the SiCOH film 12 has a structure in which the phenyl groups are bonded to silicon in a framework structure including silicon and oxygen. If the phenyl groups are received into the SiCOH film 12, the density of the SiCOH film 12 gets lowered, resulting in the SiCOH film 12 having a low dielectric constant of, e.g., about 2.8 to 3.2.

Here, the meaning of "no nitrogen" at the phrase "organic silane gas containing no nitrogen" is not that the gas does not contain the nitrogen as unavoidable impurity but that the gas does not contain the nitrogen as the original component of a compound. In other words, the organic silane gas containing only the nitrogen as unavoidable impurity is considered as the organic silane gas containing "no nitrogen".

As described above, by forming the SiCOH film 12 at a low temperature, the number of the phenyl groups that are received into the SiCOH film 12 is increased. In the meantime, a large amount of moisture is also received. The reason why the moisture is received thereinto will be described hereinafter. In the film formation process at a low temperature of 200° C. or lower, the film density gets lowered. As a result, the moisture inevitably included in the processing gas atmosphere is absorbed into the SiCOH film 12, thereby forming hydroxyl groups. Moreover, the moisture is produced in the reactions of hydrogen and oxygen of the DMPS gas as the source gas and the produced moisture is received into the SiCOH film 12. As a result, it is considered that the SiCOH film 12 absorbs the moisture, that is, Si—OH is formed. As such, if the hydroxyl groups exist in the SiCOH film 12, the dielectric constant gets higher. This requires the after-treatment (quality modification) process, which will be described below.

The quality modification process is a process that supplies to the SiCOH film 12 an energy that is enough to remove the moisture from the SiCOH film 12. In the present embodiment, the energy is supplied in the form of heat. Specifically, the wafer W is located in, e.g., a nonreactive gas atmosphere, and the wafer W is heated at a temperature higher than 200° C., for example, a preset value in a range of higher than 200° C. and equal to and lower than 400° C.

Moreover, as checked in experiments which will be described later, even if the wafer W in which the SiCOH film has received the phenyl group once is heated at a temperature of 200° C. or higher, the phenyl group stably remains in the SiCOH film 12. In contrast, when the temperature of the wafer W is 200° C. or higher during the formation of the SiCOH film 12, the number of the phenyl groups included in the SiCOH film 12 is decreased. Accordingly, it is considered that, at the high temperature of 200° C. or higher, it is difficult to perform an adsorption reaction of the phenyl groups on the wafer W and it is easy to perform a ring-opening reaction of the free phenyl group. For that reason, it is considered that, at the low temperature, the phenyl group is easily received into the SiCOH film 12.

Figure 1C:
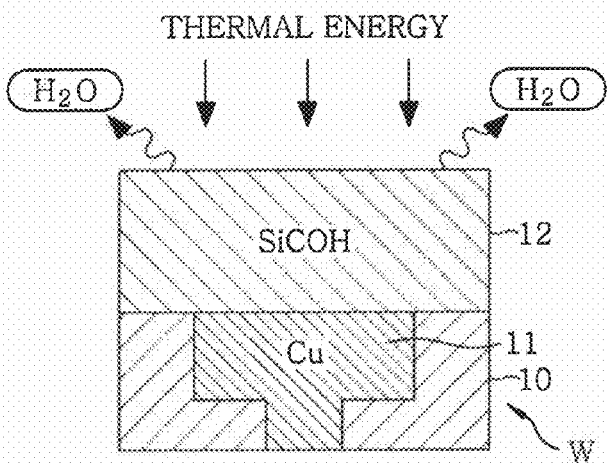
FIG. 1C is still another cross sectional view showing the method for manufacturing the semiconductor device in accordance with the embodiment of the present invention.

Next, as shown in FIG. 1C, the quality modification process for supplying energy, e.g., heat, as the after-treatment process is performed on the SiCOH film 12. By this quality modification process, the bonding of the hydroxyl group and silicon is broken in the SiCOH film 12 and a water-extracting reaction and a condensation reaction are performed as follows.

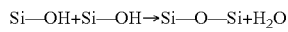

Figure 2C:
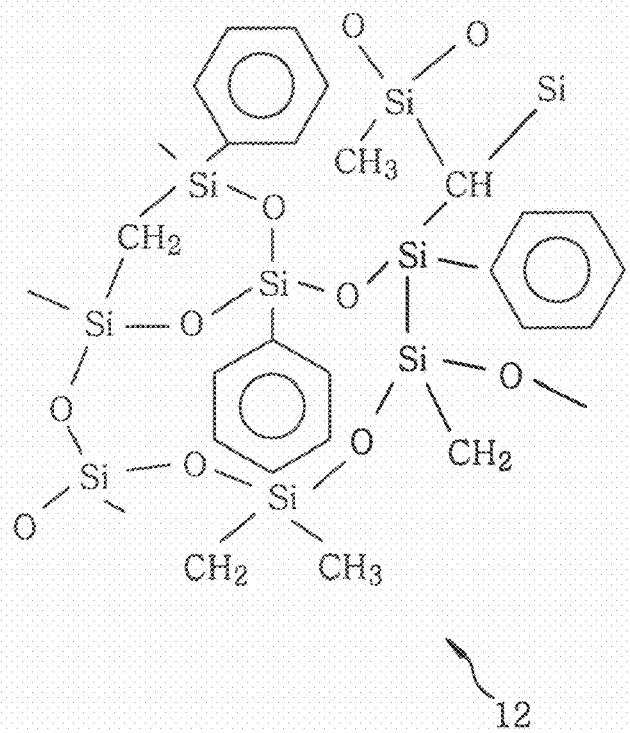
FIG. 2C shows still another example of the structure of the interlayer dielectric film capable of being formed by the process shown in FIGS. 1A to 1F.

As shown in FIG. 2B, the hydroxyl group as moisture is released from the SiCOH film 12 and, as a result, a framework structure (bonding) of Si—O—Si is formed as shown in FIG. 2C. Further, the moisture received into the SiCOH film 12 is released from the SiCOH film 12 by the quality modification process. Moreover, the phenyl group that has already been received into the SiCOH film 12 stably remains in the SiCOH film 12 at such an energy level as will be obvious through the following experiments.

Figure 1D:
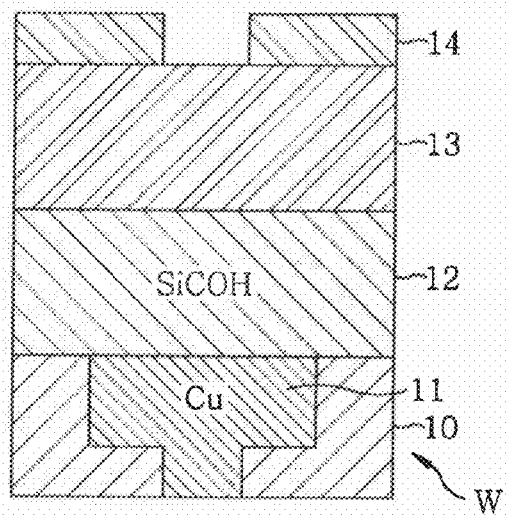
FIG. 1D is still another cross sectional view showing the method for manufacturing the semiconductor device in accordance with the embodiment of the present invention.

Successively, as shown in FIG. 1D, a sacrificial film serving as a mask for forming a via hole and a wiring buried recess is stacked on a surface of the SiCOH film 12. A patterned photoresist mask 14 is formed on a surface of the sacrificial film 13. The sacrificial film 13 is formed, for example, with a laminated body where a plurality of different kinds of films is laminated.

Figure 1E:
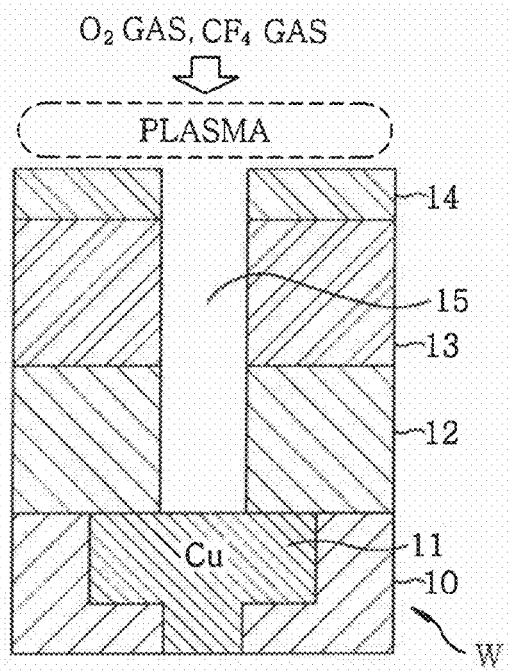
FIG. 1E is still another cross sectional view showing the method for manufacturing the semiconductor device in accordance with the embodiment of the present invention.

Then, a gas containing carbon and fluorine, for example, an etching gas including $CF_4$ gas and oxygen gas, is converted into a plasma by using, e.g., a well-known parallel plate plasma etching apparatus. As shown in FIG. 1E, by supplying the plasma to the wafer W, the sacrificial film 13 and the SiCOH film 12 are etched to form a hole 15 to be a via hole. As described above, many phenyl groups are received into the SiCOH film 10 or 12 and it is difficult that the phenyl groups are released even though they are exposed to the plasma. Accordingly, the SiCOH film 12 is not significantly damaged in the etching treatment.

Figure 1F:
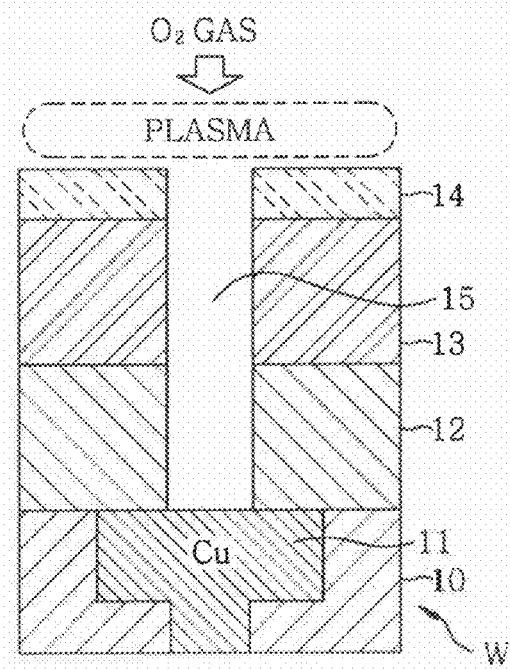
FIG. 1F is still another cross sectional view showing the method for manufacturing the semiconductor device in accordance with the embodiment of the present invention.

Next, as shown in FIG. 1F, the photoresist mask 14 is carbonized and removed by converting an ashing gas such as oxygen gas or the like to a plasma. At this time, even though the SiCOH film 12 is also exposed to the plasma, the SiCOH film 12 is not significantly damaged.

Figure 3:
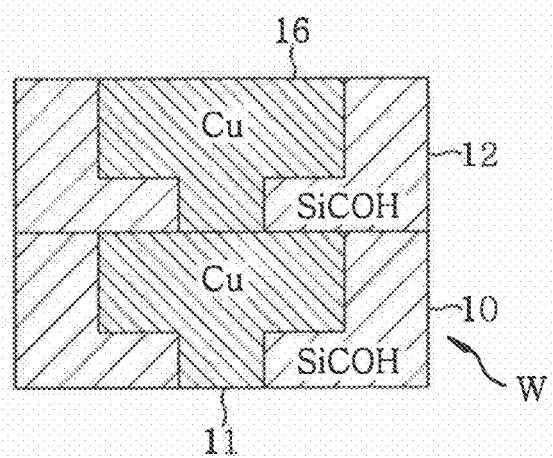
FIG. 3 is a cross sectional view showing a substrate in which a two-staged circuit layer is formed by the process shown in FIGS. 1A to 1F.

Thereafter, by using the sacrificial film 13, a wiring buried recess (trench) is formed on the SiCOH film 12 by the plasma etching. A metal, e.g., Cu, is buried in the recess and the hole 15. A remaining metal portion is removed by a chemical mechanical polishing (CMP) process to form a wire 16 as shown in FIG. 3. Moreover, as described above, due to having the framework structure of Si—O—Si, the SiCOH film 12 has a high mechanical strength. Accordingly, even if a mechanical load is applied to the SiCOH film 12 in the CMP process, no damage such as crack, deficiency and/or the like is done to the SiCOH film 12.

In accordance with the aforementioned embodiment, by employing oxygen gas and organic silane gas having the phenyl group, the SiCOH film 12 is formed at a low temperature of 200° C. or lower by the plasma CVD. Accordingly, as described above, many phenyl groups having difficulty in being released in the plasma treatment can be received into the SiCOH film 12 through active species, while a content ratio of the methyl groups that are easily released in the plasma treatment can be suppressed. Meanwhile, since the temperature is low during the film formation, as described above, the moisture causing the dielectric constant to be increased may be received into the SiCOH film 12.

However, the framework of Si—O—Si can be formed by performing a water-extracting process including the water-extracting and the condensation reaction through the quality modification process supplying heat as the after-treatment process. Accordingly, it is possible to form a low-permittivity film having a great plasma resistance and a great mechanical strength. Further, by using the low-permittivity film as an interlayer dielectric film on which the plasma etching and/or plasma ashing are performed, it is possible to obtain a semiconductor device having good characteristics.

Moreover, as described above, the organic silane gas and the oxygen gas are employed as the processing gas. Alternatively, e.g., only the organic silane gas may be employed to form an SiCH film. Like the SICOH film 12, for the SiCH film, it is possible to obtain a good plasma resistance and/or a good mechanical strength, and further a relative dielectric constant close to that of the SiCOH film 12.

As the organic silane gas, a methyl-phenyl-silane (MPS) gas, a trimethyl-phenyl-silane (TMPS) or the like may be employed in addition to the DMPS gas.

Figure 4:
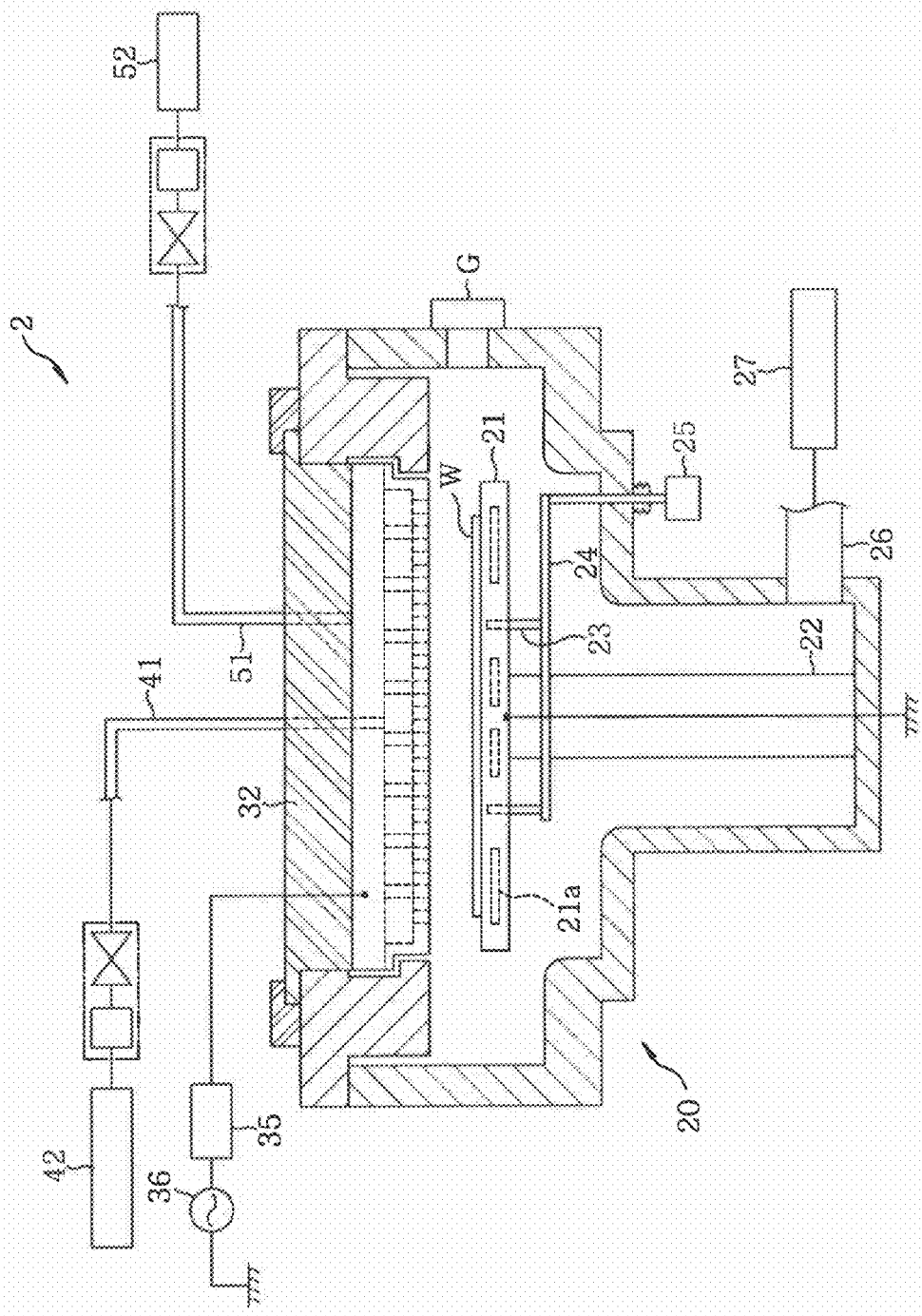
FIG. 4 is a cross sectional view showing an example of an apparatus for forming an interlayer dielectric film.

Next, an example of apparatuses that are usable for performing each of the above processes will be described. FIG. 4 shows an example of a plasma CVD apparatus 2 for performing a film formation process. The reference numeral 20 denotes a processing chamber (vacuum chamber) made of, e.g., aluminum. Provided in the processing chamber 20 is a heating unit (not shown) for heating an inner wall thereof. In the processing chamber 20, there are provided a stage 21 for horizontally mounting a wafer W and a supporting member 22 for supporting the stage 21. The stage 21 is grounded and serves as a lower electrode.

A heater 21a is provided in the stage 21. The heater 21a serves as a temperature control unit which controls the temperature of the wafer W mounted on the stage 21 to maintain it at a processing temperature by heating the stage 21. The reference numerals 23, 24, and 25 denote an elevation pin, a supporting member, and an elevation mechanism, respectively. Connected to a bottom portion of the processing chamber 20 is a vacuum pump 27 via an exhaust pipe 26. The reference letter G denotes a gate valve. Provided at a top portion of the processing chamber 20 is a shower head 32 to face the stage 21. The shower head 32 is insulated from the processing chamber 20. Connected to the shower head 32 are a silane gas supply line 41 included in a unit for supplying an organic silane gas (organic silane gas supply unit) and an oxygen gas supply line 51 included in a unit for supplying an oxygen gas (oxygen gas supply unit). The silane gas supply line 41 and the oxygen gas supply line 51 are connected to a DMPS gas source 42 and an oxygen gas source 52, respectively. The shower head 32 also serves as an upper electrode. Connected to a top surface of the shower head 32 is a radio frequency (RF) power supply 36 via a matching unit 35. The RF power supply 36 serves as an activation unit for activating a gas in the processing chamber to generate a plasma.

Next, an operation of the plasma CVD apparatus 2 will be described. Firstly, the stage 21 is heated to a preset temperature by the heater 21a such that the temperature of the wafer W is kept at a preset value, e.g., 55° C. and an inner wall of the processing chamber 20 is heated by a heater (not shown) thereof to maintain the temperature of the processing chamber 20 at a preset value.

Thereafter, the gate valve G is opened and the wafer W is loaded into the processing chamber 20 by a transfer unit (not shown). Then, the wafer W is mounted on a top surface of the stage 21 with the help of the elevation pin 23. After the transfer unit (not shown) is withdrawn from the processing chamber 20, the gate valve G is closed and the pressure inside the processing chamber 20 is set to a preset vacuum level by using the vacuum pump 27. Successively, a processing gas is supplied at a preset flow rate from the DMPS gas source 42 and the oxygen gas source 52, and a radio frequency (RF) power is supplied from the RF power supply 36 to the processing chamber 20. As described above, the processing gas is converted to a plasma by the radio frequency power, and the SiCOH film is formed by supplying the plasma to the wafer W during a preset period of time. After the preset period of time, the supply of the processing gas and the RF power is stopped. Then, the remaining gas inside the processing gas 20 is exhausted. Thereafter, the wafer W is taken out of the processing chamber 20.

Figure 5:
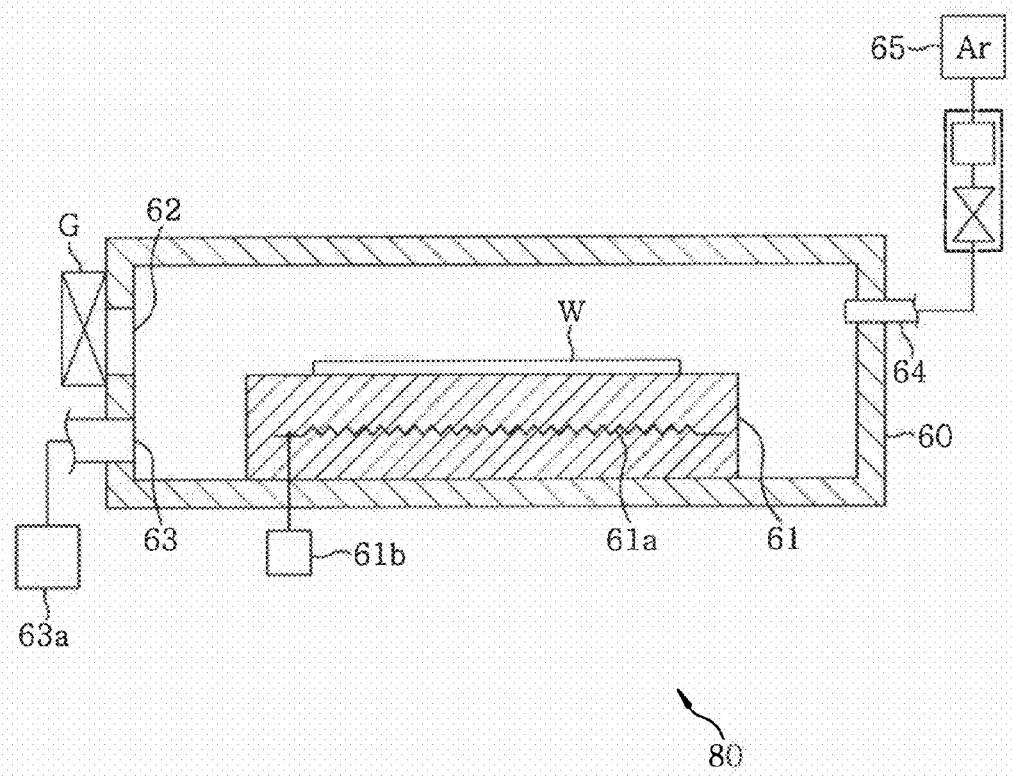
FIG. 5 is a cross sectional view showing an example of an apparatus for performing an after-treatment process.

Next, an annealing as an after-treatment process and a heating apparatus 3 as an example of an after-treatment apparatus for performing the after-treatment process will be described with reference to FIG. 5. The heating apparatus 3 includes a processing chamber 60 and a mounting table 61. The mounting table 61 includes a heater 61a. The heater 61a, which is connected to a power supply 61b, is configured to heat the wafer W in a temperature range from, e.g., 200° C. to 400° C. That is, the heater 61a serves as an energy supply unit for supplying energy to the wafer W. An elevation unit (not shown) such as a pin or the like is provided in the mounting table 61. The elevation unit is configured to facilitate the transfer of the wafer W between the mounting table 61 and a transfer unit (not shown) extendable through a transfer port 62 provided at a sidewall of the processing chamber 60. The reference letter G denotes a gate valve and the reference numerals 63, 63a, 64, and 65 denote an exhaust port, a vacuum pump, a gas supply line, and an Ar gas source.

In the heating apparatus 3, the mounting table 61 is firstly heated by the heater 61a such that the temperature of the wafer W can be kept at a preset temperature, e.g., 400° C. Then, the gate valve G is opened and the wafer W is mounted on the mounting table 61 by the transfer unit (not shown). If the transfer unit (not shown) is withdrawn from the processing chamber 60, the gate valve G is closed and the pressure inside the processing chamber 60 is set as a preset vacuum level by a vacuum pump 63a. Then, as described above, the moisture is released from the wafer W by heating the wafer W at this temperature for, e.g., one hour. At this time, the moisture released from the wafer W may be forcibly exhausted toward the vacuum pump 63a by supplying Ar gas to the wafer W. Thereafter, the wafer W is taken out of the processing chamber 60 by the transfer unit (not shown).

Figure 6:
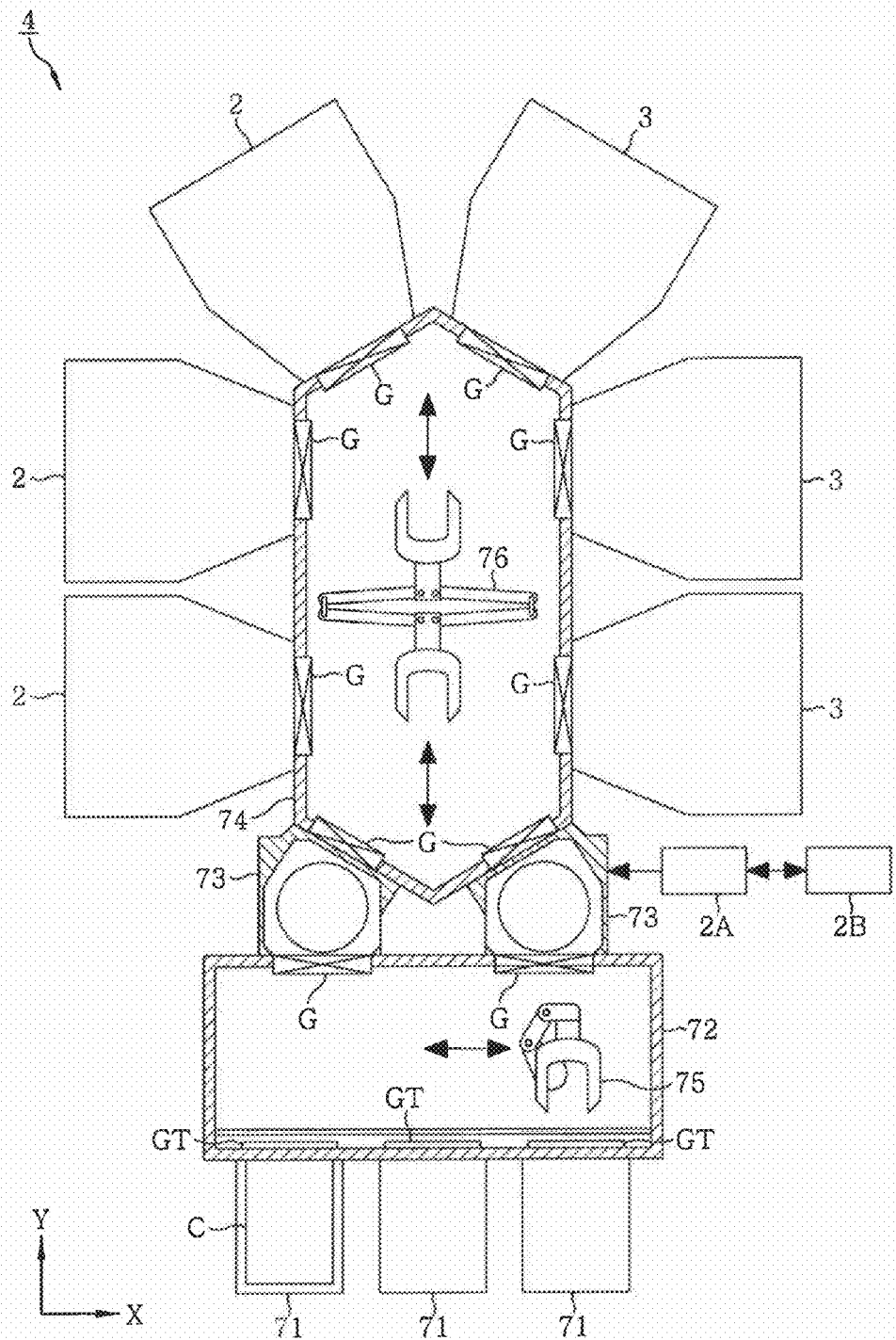
FIG. 6 a schematic plan view showing an example of a substrate processing apparatus including a film formation apparatus and an apparatus for performing an after-treatment process.

The plasma CVD apparatus 2 and the heating apparatus 3 may be respectively provided as an independent apparatus. Alternatively, as shown in FIG. 6, the plasma CVD apparatus 2 and the heating apparatus 3 may be provided as elements of, e.g., a substrate processing apparatus 4 as a multi-chamber system. Described in the following is the substrate processing apparatus 4.

The substrate processing apparatus 4 includes a first transfer chamber 72, two load-lock chambers 73, and a second transfer chamber 74. The second transfer chamber 74, which is provided as a vacuum transfer module, serves as a space that is kept at a vacuum level and used for the transferring of the wafer W. Provided at a front side of the first transfer chamber 72 is load ports 71 on each of which a sealed carrier C is mounted. A plurality of, e.g., 25, wafers W is accommodated in the carrier C. Further, openable gate doors GT are provided on a front wall of the first transfer chamber 72. The gate doors GT are connected to the respective carriers C mounted on the load ports 71, and the gate doors GT and covers of the carriers C together are openable. Airtightly connected to the second transfer chamber 74 are the plasma CVD apparatus(es) 2 and the heating apparatus(es) 3. An inside of the second transfer chamber 74 is set to be at, e.g., a vacuum atmosphere.

A first and a second transfer unit 75 and 76 are provided in the first and the second transfer chamber 72 and 74, respectively. The first transfer unit 75 has a transfer arm for transferring the wafer W between the load port 71 and the load-lock chamber 73. The second transfer unit 76 has a transfer arm for transferring the wafer W among the load-lock chamber 73, the plasma CVD apparatus 2 and the heating apparatus 3.

The substrate processing apparatus 4 includes a control device 2A including, e.g., a computer. The control device 2A includes a data processing unit including a program, a memory, and a central processing unit (CPU), and the like. By the program, a control signal is transmitted from the control device 2A to each part of the substrate processing apparatus 4 and a command for executing each of the described stages is transferred. Moreover, in the memory, there is provided a region in which processing parameters such as processing pressure, processing temperature, processing time, gas flow rate, and power values are written. When the CPU executes each command of the program, the parameters are read and control signals corresponding to the parameter values are transmitted to each part of the substrate processing apparatus 4. The program (including programs related to input manipulation and display of the processing parameters) is stored in a storage medium 2B such as a flexible disk, a compact disk, a hard disk, a magneto-optical disk (MO) and the like to be installed in the control device 2A.

Next, an operation of the substrate processing apparatus 4 will be described. Once the carrier C is mounted in the load port 71 and connected to the first transfer chamber 72, the gate door GT and the cover of the carrier C together are opened. Then, the wafer W in the carrier C is transferred to the first transfer chamber 72 by the first transfer unit 75 and, then, the transferred wafer is loaded into the load-lock chamber 73. Successively, the wafer W is transferred to the plasma CVD apparatus 2 through the second transfer chamber 74 by the second transfer unit 76. After the aforementioned film formation process is performed in the plasma CVD apparatus 2, the wafer W is taken out of the plasma CVD apparatus 2 by the second transfer unit 76. Then, the wafer W is transferred to the heating apparatus 3 by the second transfer unit 76. In the heating apparatus 3, the wafer W is subjected to the after-treatment process. Thereafter, the wafer W is returned in the order reversed to the loading order. Alternatively, the after-treatment process may be performed in the plasma CVD apparatus 2, even though the plasma CVD apparatus 2 and the heating apparatus 3 are separately provided in the above.

[Second Embodiment]

Next, a second embodiment of the present invention will be described. The second embodiment has a different feature from the first embodiment in which the after-treatment process has been described. What is described may be identical to that of the first embodiment except for the after-treatment process. Accordingly, only the after-treatment process will be described and any redundant description will not be repeated.

Figure 7:
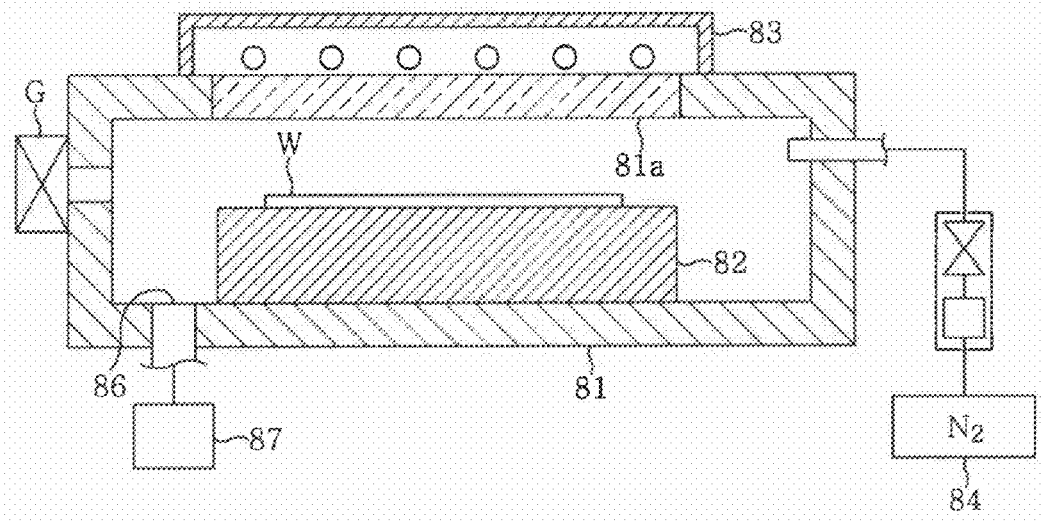
FIG. 7 is a cross sectional view showing another example of an apparatus for performing an after-treatment process.

As an example of the after-treatment apparatus that can be employed for the after-treatment process, an UV irradiation apparatus 80 will be firstly described with reference to FIG. 7. The UV irradiation apparatus 80 includes a processing chamber 81 and a mounting table 82 provided at a lower portion in the processing chamber 81. Provided at an upper portion of the processing chamber 81 and on top thereof are a transparent window 81a and an UV irradiation unit 83 to oppositely face the wafer W mounted on the mounting table 82. The UV irradiation unit 83 is configured to irradiate an ultraviolet (UV) having a wavelength of, e.g., 172 nm and a power of, e.g., 12 W/cm$^2$ toward a surface area of the wafer W through the transparent window 81a. That is, the UV irradiation unit 83 serves as an energy supply unit for supplying energy to the wafer W. The reference numerals 84, 86, and 87 denote a nonreactive gas (e.g., nitrogen gas) supply source, an exhaust port, and a vacuum pump, respectively.

In the UV irradiation apparatus 80, if the wafer W is mounted on the mounting table 82, the processing chamber 81 is evacuated to keep it at a preset vacuum level by the vacuum pump 87. Moreover, a gas (e.g., nitrogen gas) is supplied from the nonreactive gas (e.g., nitrogen gas) supply source 84. Then, by irradiating the UV having a preset wavelength to the wafer W during a preset period of time (e.g., 5 minutes), the after-treatment process is performed on the wafer W. Thereafter, the irradiation of UV is stopped, and then the wafer W is taken out off the processing chamber 81.

As the after-treatment process, by irradiating the UV, the moisture is released from the SiCOH film 12 in a same way as the heating of the wafer W in the first embodiment. As a result, as described above, it is possible to accelerate the formation of the framework structure of Si—O—Si and improve the plasma resistance and the mechanical strength of the SiCOH film 12.

[Third Embodiment]

Next, a third embodiment of the present invention will be described. Similar to the second embodiment, the third embodiment has a different feature from the first embodiment in which the after-treatment process has been described. What is described may be identical to that of the first embodiment except for the after-treatment process. Accordingly, only the after-treatment process will be described and any redundant description will not be repeated.

Figure 8:
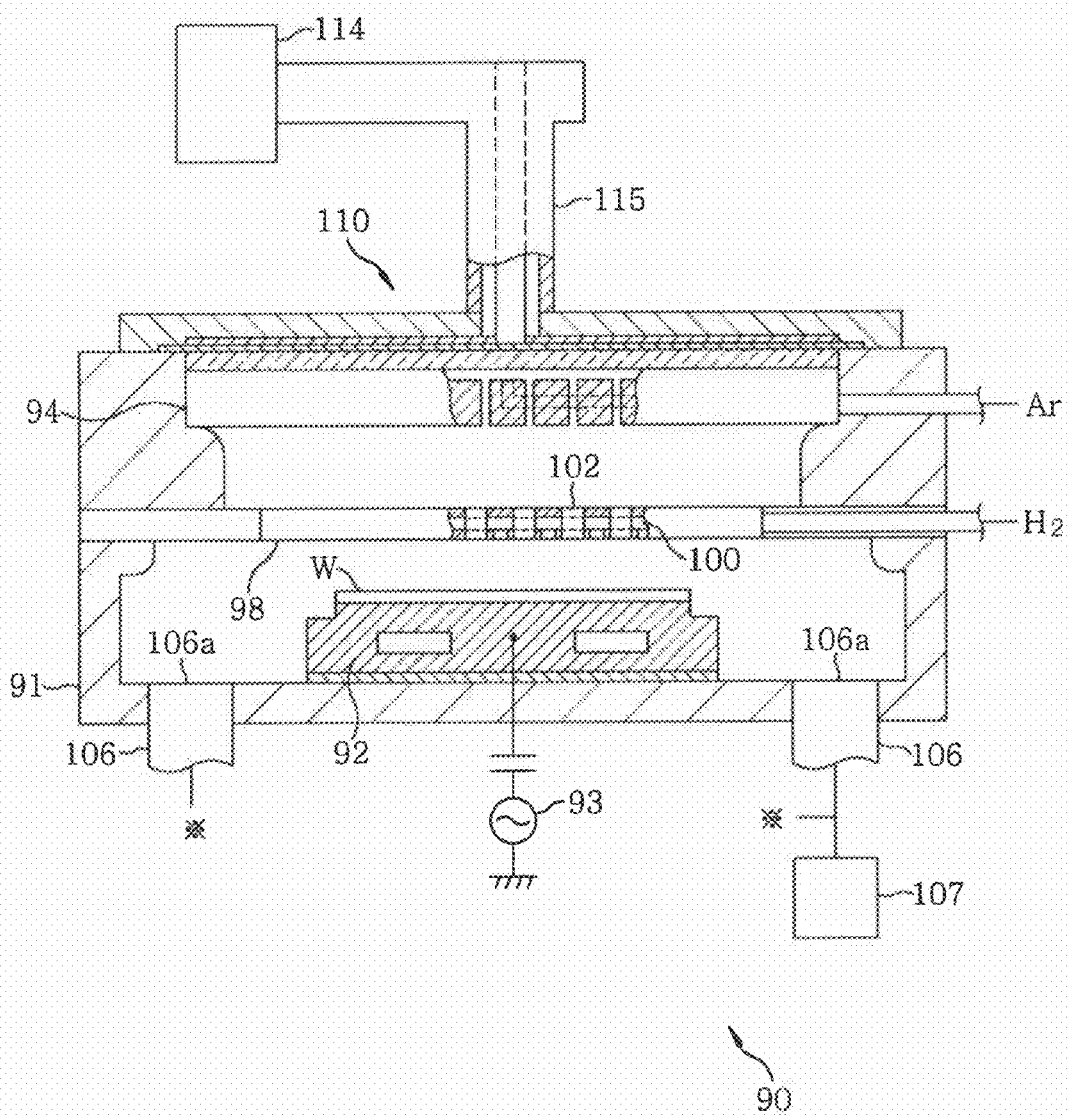
FIG. 8 is a cross sectional view showing yet another example of an apparatus for performing an after-treatment process.

As an example of the after-treatment apparatus that can be employed for this process, a well-known microwave plasma apparatus 90 will be firstly described with reference to FIG. 8. The microwave plasma apparatus 90 includes a processing chamber 91 as a vacuum chamber, a mounting table 92 having a temperature control unit, and an RF power supply 93 connected to the mounting table 92 and supplying a bias RF power of, e.g., 13.56 MHz.

Provided at a top portion of the processing chamber 91 is a shower head serving as a first gas supply unit 94 made of an insulating material. Provided below the first gas supply unit 94 is a conductive shower head 98 (second gas supply unit 98) having a substantially circular outer appearance, where gas supply paths 100 are formed in a lattice pattern. Plasma generation gases, e.g., Ar gas and H$_2$ gas, are supplied from the first and the second gas supply unit 94 and 98, respectively.

In the microwave plasma apparatus 90, the Ar gas, for example, is supplied from the first gas supply unit 94 to be activated (to be converted to a plasma). Then, by the plasma descending through openings 102 as an inter-space of the lattices of the second gas supply unit 98, the H$_2$ gas supplied from the second gas supply unit 98 is activated to be converted to a plasma. Meanwhile, a vacuum exhaust unit 107 is connected, via an exhaust line 106, to an exhaust port 106a provided at a lower end side of the processing chamber 91.

An antenna section 110 is provided at an upper portion of the first gas supply unit 94. Via a coaxial waveguide 115, the antenna section 110 is connected to a microwave generation unit 114 for generating a microwave having a frequency of, e.g., 2.54 GHz or 8.4 GHz. In the microwave plasma apparatus 90, an RF wave (microwave) having the frequency of 2.54 GHz is downwardly irradiated from the microwave generation unit 114 to a processing space.

By the microwave generated at the microwave generation unit 114, the plasma of the Ar gas is excited in a space between the first and the second gas supply unit 94 and 98. Then, through the aforementioned stages, active species of the H$_2$ gas are generated in the processing space. The water-extracting process is performed on the SiCOH film 12 by supplying the species to a surface of the wafer W. Accordingly, the moisture is released from the wafer W in a same way as in the first and the second embodiment.

As a result, as described above, it is possible to accelerate the formation of the framework structure of Si—O—Si and improve the plasma resistance and the mechanical strength of the SiCOH film 12. As such, since a low electron-density (so-called soft) plasma is obtained in the microwave plasma apparatus 90, it is preferable to be applied to the quality modification process of a thin film. In the third embodiment, the microwave generation unit 114 serves as the energy supply unit for supplying energy to the wafer W.

As in the heating apparatus 3, the UV irradiation apparatus 80 and the microwave plasma apparatus 90 may be connected to the second transfer chamber 74 of the substrate processing apparatus 4. Moreover, the after-treatment process may be performed by the heating method, the UV irradiation method, and the microwave plasma method or by a combination thereof.

Experiments

Described below are experiments performed to verify the effects of the present invention.

TEST EXAMPLE 1

A SiCH film was formed on a wafer W by employing the DMPS gas and no oxygen gas as a processing gas under the following conditions. Then, infrared absorption spectra of the formed SiCH film were measured by a Fourier transform infrared (FTIR) spectroscopy. Moreover, a heat treatment as an additional after-treatment process was performed, under the following conditions, on the wafer subjected to the film formation process at 200° C. Corresponding FTIR spectra were measured as well.

In addition, when the measured FTIR spectra of a plurality of samples are compared, each result has been corrected based on the film thickness of the corresponding sample to relatively evaluate the result of each sample. The same has been applied to the following test results.

(Film Formation Conditions)
Film formation temperature: 200° C., 300° C., 350° C.
Processing gas: DMPS gas/He gas=75/75 mL/min(sccm)
RF power: 80 W
Pressure: 10 Pa (75 mTorr)
(Heat Treatment Conditions)
Employed gas: Ar gas=500 mL/min(sccm)
Heat treatment temperature: 400° C.
Pressure: 267 Pa (2.0 Torr)
Processing time: 1 hour
(Test Results)

Figure 9:
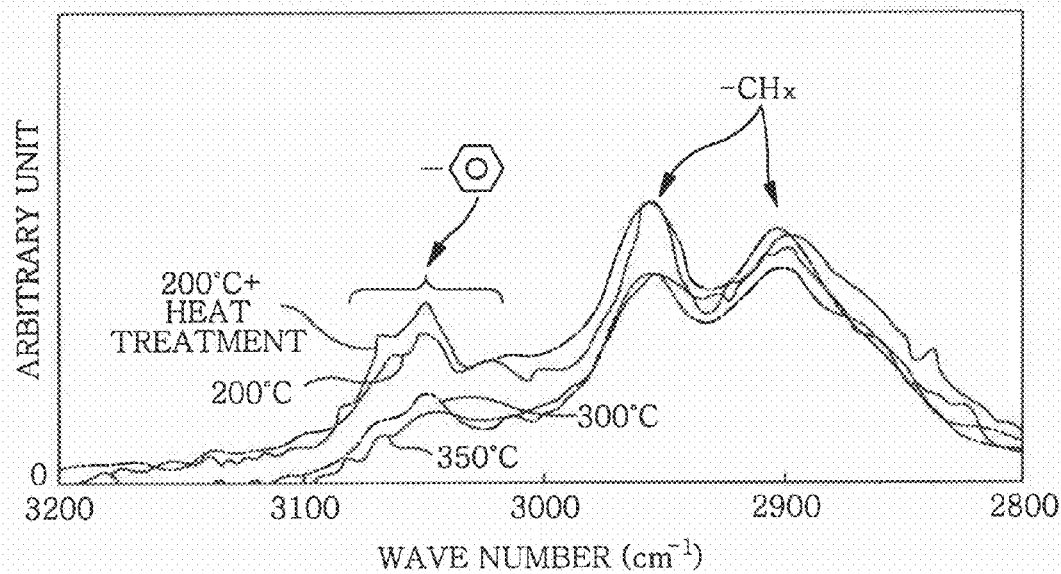
FIG. 9 is a characteristic graph showing a test result.

As shown in FIG. 9, for each sample, a peak corresponding to a phenyl group was found at a wave number within a range from 3000 to 3100 $cm^{-1}$. The peak was reduced as the film formation temperature was increased. However, in the case that the heat treatment was performed after a film was formed at 200° C., a corresponding peak value was not reduced. Accordingly, it can be deduced that it was preferable to perform the film formation at a low temperature of 200° C. or lower in order that more phenyl groups were received into the wafer W. It is also seen that the phenyl groups that had been received once into the wafer W stably remained in and were not released from the wafer W in spite of the heat treatment at 400° C. as the after-treatment process.

TEST EXAMPLE 2

Figure 10:
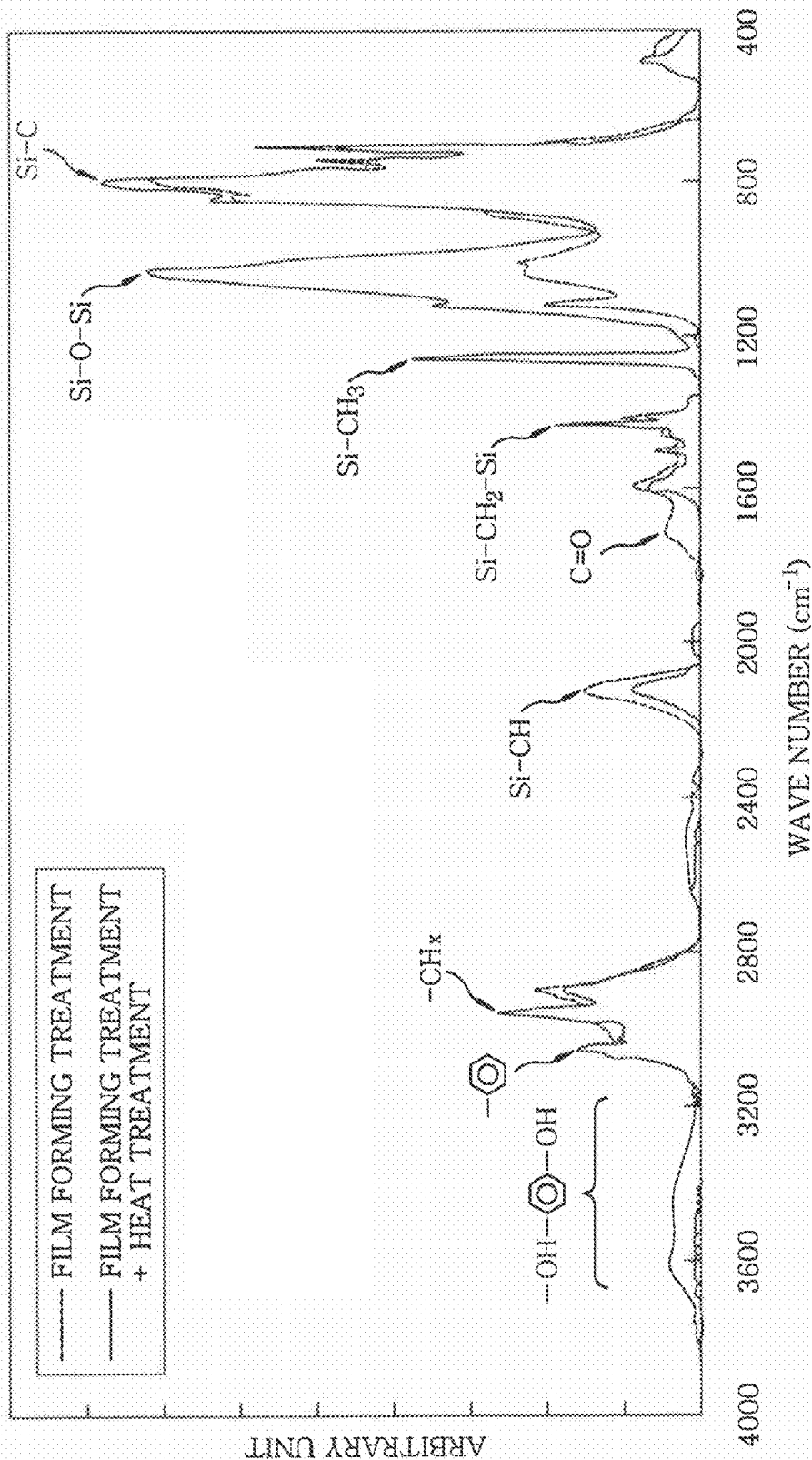
FIG. 10 is a characteristic graph showing another test result.

Next, for a sample of a film formed at 200° C. without any after-treatment process and a sample of a film formed at 200° C. with a heat treatment performed as a after-treatment process, respective FTIR spectra were measured in a wide range of wave number. From the result shown in FIG. 10, for the sample without the after-treatment process, a noticeable peak corresponding to the hydroxyl group was found in a wave number range between 3200 and 3700 $cm^{-1}$.

On the other hand, for the sample with the after-treatment process, the peak corresponding to the hydroxyl group was very small. In contrast, a peak caused by the bonding of Si—O—Si at the wave number of about 1000 $cm^{-1}$ was very prominent for the sample formed with the after-treatment process as compared with that for the sample formed without after-treatment process. Accordingly, it can be deduced that, as described above, the moisture should have been released from the SiCH film by the heat treatment and, thus, the framework structure caused by the bonding of Si—O—Si was formed.

TEST EXAMPLE 3

For each sample of the test example 1, corresponding dielectric constants and leakage currents were measured. The results were listed up in table 1. Each of the dielectric constants and each of the leakage currents were measured 9 points and 5 points, respectively, and corresponding average values were listed up.

TABLE 1

| Film formation temperature | After-treatment | K value | Leakage current |
| --- | --- | --- | --- |
| 350° C. | Not performed | 3.72 | $2.29 \times 10^{-8}$ |
| 300° C. | Not performed | 3.57 | $6.17 \times 10^{-9}$ |
| 200° C. | Not performed | 3.19 | $6.72 \times 10^{-10}$ |
| 200° C. | Performed | 2.87 | $7.28 \times 10^{-10}$ |

From the table 1, it can be seen that, as the film formation temperature got lower, the dielectric constant (K value) and the leakage current were decreased and, by performing the heat treatment, the dielectric constant was much more reduced. The reason is considered that, as described above, the phenyl group was received into the SiCH film.

TEST EXAMPLE 4

Next, an experiment in which the plasma treatment as the after-treatment process was performed by using the microwave plasma apparatus 90 will be described. In the experiment, an SiCOH film was formed by supplying the DMPS gas and the oxygen gas together. Moreover, for the comparison with the DMPS gas, another experiment was carried out by using torimethyl-silane (3MS) gas containing no phenyl group. Thereafter, corresponding FTIR spectra were measured. For the change of gas, corresponding conditions including the distance between the wafer W and the shower head 32 and the like were adjusted adequately for each gas. The film formation conditions and the plasma treatment conditions were as follows.

(Film Formation Conditions)
Film formation temperature: 55° C.
Processing gas: DMPS gas
DMPS gas=100 mL/min(sccm)
$O_2$ gas=20 mL/min(sccm)
Ar gas=600 mL/min(sccm)
: 3MS gas
3MS gas=200 mL/min(sccm)
$O_2$ gas=70 mL/min(sccm)
Ar gas=600 mL/min(sccm)
RF power: 500 W
Pressure: 300 Pa (2.25 Torr)
(Plasma Treatment Conditions)
Employed gas: $H_2$ gas=200 mL/min(sccm)
Ar gas=1000 mL/min(sccm)
Heat treatment temperature: 400° C.
Pressure: 400 Pa (3.0 Torr)
Microwave power: 2 kW
Processing time: 5 minutes
(Test Results)

Figure 11:
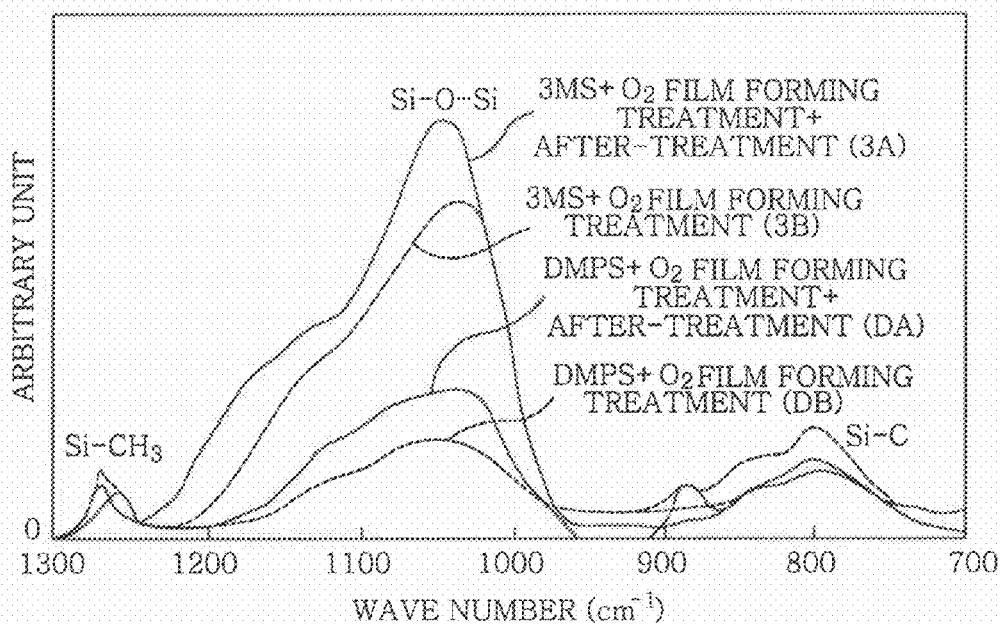
FIG. 11 is another characteristic graph showing still another test result.
Figure 12:
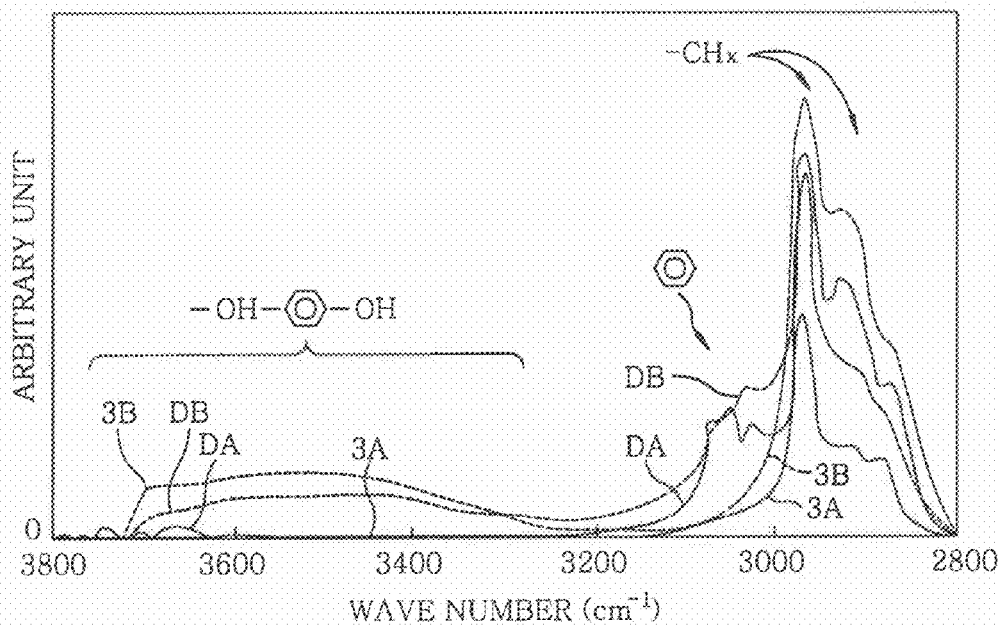
FIG. 12 is another characteristic graph showing still another test result.

The test results are shown in FIGS. 11 and 12. When the DMPS gas was employed, a peak caused by the bonding of Si—O—Si was increased at the wave number of about 1000 $cm^{-1}$ by the plasma treatment as the after-treatment process (see the curves DA and DB shown in FIGS. 11 and 12). A peak corresponding to the hydroxyl group was decreased in a wave number range of 3200 to 3700 $cm^{-1}$. Accordingly, it can be seen that, as the after-treatment process, the plasma treatment performed by using the microwave plasma apparatus 90 yielded the same effect as the heat-treatment. Moreover, in the case of employing the 3MS gas, the similar peak levels to the case of employing the DMPS were found (see the curves 3A and 3B shown in FIGS. 11 and 12).

On the other hand, no peak corresponding to the phenyl group was found in the case of employing 3MS. Accordingly, it can be seen that the phenyl group was received into the SiCOH film by employing the DMPS gas. Further, it can be seen that the phenyl group that had been received once into the SiCOH film was not released from the SiCOH film by the plasma treatment similarly to the case of the heat treatment. Similarly, in FIG. 12, the same results as in FIG. 11 were found. The redundant description is partially omitted.

TEST EXAMPLE 5

Next, an experiment in which the UV irradiation as the after-treatment process was performed will be described. Similarly to the test example 4, the DMPS gas and the 3MS gas were employed. After the film formation, the UV irradiation process was carried out. Then, corresponding dielectric constants and leakage currents were measured. The film formation conditions were the same as those of the test example 4. The UV irradiation conditions were as follows. For the sample processed by employing the 3MS gas without the after-treatment process and the sample processed by employing the 3MS gas and then subjected to the UV irradiation, the dielectric constant and the leakage current were measured one time.

(UV Irradiation Condition)
Employed gas: Ar gas=1450 mL/min(sccm)
UV wavelength: 172 nm
UV power: 12 W/cm$^2$
Pressure: 26.7 Pa (200 mTorr)
Processing time: 5 minutes
(Test Results)
Listed up in table 2 are measured results of the adjusted samples in the test example 4 as well as the samples in the test example 5.

TABLE 2

| Gas | After-treatment | K value | Leakage current A/cm$^2$ |
|---|---|---|---|
| 3MS + O$_2$ | Not performed | 3.64 | $1.70 \times 10^{-9}$ |
| | Microwave plasma | 2.80 | $2.28 \times 10^{-10}$ |
| | UV | 2.79 | $5.69 \times 10^{-10}$ |
| DMPS + O$_2$ | Not performed | 3.06 | $9.72 \times 10^{-10}$ |
| | Microwave plasma | 2.73 | $1.37 \times 10^{-9}$ |
| | UV | 2.74 | $6.92 \times 10^{-10}$ |

From the table 2, it is seen that, similarly to the microwave plasma treatment, by the UV irradiation processing, the dielectric constant and the leakage current were decreased. Moreover, in the state where no after-treatment process was performed, the characteristics were improved by employing the DMPS gas rather than employing the 3MS gas.

While the invention has been shown and described with respect to the embodiments, it will be understood by those skilled in the art that various changes and modification may be made without departing from the scope of the invention as defined in the following claims.

What is claimed is:

1. A semiconductor manufacturing apparatus comprising a plasma CVD apparatus including: a processing chamber for accommodating a substrate; a supply unit for supplying to the processing chamber an organic silane gas containing a phenyl group and silicon and only unavoidable impurity nitrogen; an activation unit for activating a gas in the processing chamber to generate a plasma; and a control unit for controlling processing temperature of the processing apparatus, wherein temperature of the substrate is maintained to be equal to or lower than 200° C. and the substrate is exposed to the plasma to form a thin film on the substrate, and an after-treatment apparatus including an energy supply unit for supplying energy to the substrate on which a thin film is formed by the plasma CVD apparatus, wherein moisture is released from the thin film by supplying the energy to the substrate to form a low-permittivity film.

2. The semiconductor manufacturing apparatus of claim 1, wherein the plasma CVD apparatus further includes a supply unit for supplying an oxygen gas to the processing chamber, and the activation unit activates the oxygen gas and the organic silane gas together in the processing chamber.

3. The semiconductor manufacturing apparatus of claim 1, wherein the after-treatment apparatus includes at least one of devices for heating the substrate to be maintained at a temperature higher than 200° C, for irradiating an ultraviolet to a surface of the substrate, and for exposing the surface of the substrate to a plasma obtained from hydrogen gas.

4. The semiconductor manufacturing apparatus of claim 1, further comprising a vacuum transfer module arranged between the plasma CVD apparatus and the after-treatment apparatus.

5. The semiconductor manufacturing apparatus of claim 1, wherein the plasma CVD apparatus and the after-treatment apparatus are provided as a single unit.

6. A storage medium storing a program that is executable by a control device for controlling a semiconductor manufacturing apparatus, the program performing a method for manufacturing a semiconductor device in a semiconductor manufacturing apparatus by being executed by the control device, the method comprising steps of:

(a) forming a thin film containing the phenyl group and silicon on a substrate while obtaining a plasma by activating an organic silane gas containing a phenyl group and silicon and nitrogen as not original component but unavoidable impurity and exposing the substrate to the plasma, temperature of the substrate being set at 200° C or lower; and (b) obtaining a low-permittivity film by supplying an energy to the substrate to allow moisture to be released from the thin film.

* * * * *